United States Patent [19]
Lim et al.

[11] Patent Number: 5,481,209
[45] Date of Patent: Jan. 2, 1996

[54] CLOCK DISTRIBUTION AND CONTROL IN AN INTEGRATED CIRCUIT

[75] Inventors: Raymond H. Lim; Tania Chur; Jen-Hsun Huang, all of San Jose, Calif.

[73] Assignee: LSI Logic Corporation, Milpitas, Calif.

[21] Appl. No.: 124,093

[22] Filed: Sep. 20, 1993

[51] Int. Cl.[6] .......................... H03K 19/00; H01L 25/00
[52] U.S. Cl. ................. 326/93; 326/101; 257/208
[58] Field of Search .................... 307/480, 482.1, 307/443; 364/488–490; 326/93, 101, 21; 257/207, 208, 659, 664

[56] References Cited

U.S. PATENT DOCUMENTS

| | | |
|---|---|---|
| 4,769,558 | 9/1988 | Bach .......................... 307/480 |
| 5,013,942 | 5/1991 | Nishimura et al. ............... 307/480 |
| 5,077,676 | 12/1991 | Johnson et al. ................ 364/489 |
| 5,122,693 | 6/1992 | Honda et al. .................. 307/480 |
| 5,164,817 | 11/1992 | Eisenstadt .................... 307/480 |
| 5,172,230 | 12/1992 | Watanabe et al. ............... 307/480 |
| 5,270,592 | 12/1993 | Takahashi et al. .............. 307/482.1 |

Primary Examiner—Edward P. Westin
Assistant Examiner—Jon Santamauro

[57] ABSTRACT

An apparatus and method for improved clock distribution and control in an integrated circuit which minimizes clock skew between various parts of the integrated circuit chip. Clock loads are evenly distributed between tributaries. Capacitive loading is utilized to balance any differences between tributaries and for minimizing clock skew throughout the integrated circuit.

5 Claims, 5 Drawing Sheets

CLOCK DISTRIBUTION AND CONTROL IN AN INTEGRATED CIRCUIT

BACKGROUND OF THE INVENTION

1. Field of the Invention

This invention relates generally to digital integrated circuits, and in particular, to an improved apparatus and method for distributing and controlling clock pulses, and minimizing clock skew thereof, in a digital integrated circuit.

2. Description of the Related Technology

Semiconductor integrated circuits comprise the majority of electronic circuits in computers and other digital electronic products. Present technology integrated circuits may contain millions of transistors and be configured, for example, as a central processing unit (CPU), arithmetic logic unit (ALU), random access memory (RAM), programmable logic array (PLA), application specific integrated circuit (ASIC), or digital signal processor (DSP). Both sophistication and speed of operation of these integrated circuits have rapidly increased because of improvements in integrated circuit manufacturing technologies resulting in smaller and faster devices.

In complex digital integrated circuits, a clock signal is normally required to operate multistate logic circuits such as the aforementioned CPU, ALU, RAM, PLA, ASIC, and DSP integrated circuits. The clock signal must be distributed throughout the integrated circuit chip to logic circuits contained therein. Multiple clock signals may be desired or required depending on the functionality of the integrated circuit.

Design of complex integrated circuits is accomplished by computer simulation which allows the integrated circuit designer to easily implement and test his design before committing it to silicon. In designing the integrated circuit layout by computer, one of the requirements is to distribute the aforementioned clock signals. These clock signals must be routed from the clock input pad which will be connected to a leadframe lead that is used as an external clock pin input and connects to an external system circuit board having a computer system clock thereon. The clock signal from the clock input pad is routed by means of a main trunk that feeds tributaries. The tributaries in turn drive loads requiring the clock signal.

Clock distribution technology utilizes a main trunk with tributaries branching out from the main trunk as needed for connection to the logic within the integrated circuit chip. Depending on the loading requirements of the integrated circuit logic, active device buffer circuits are used to drive the various integrated circuit loads.

Referring to FIGS. 1 through 3, prior art clock distribution systems are illustrated in schematic block diagram. An integrated circuit chip die 10 is comprised of logic circuits (not illustrated). Some of the logic circuits require a clock signal to function. The clock signal may be generated off the chip 10 and connected to an exterior clock input pin 12. The input pin 12 connects through, for example, a lead frame (not illustrated) to a buffer 14. The output of buffer 14 connects to a clock distribution trunk 16. Trunk buffers 14a and 14b have been used to more evenly distribute clock drive to both ends of the trunk 16.

The trunk 16 has a plurality of tributaries 18 connected thereto. Branches 20 connect the loads (not illustrated) to the clock signal tributaries 18. When the loads require increased clock signal power, tributary buffers 15 have been used.

All electronic circuit loads have resistance, inductance and capacitance inherent with the physical structure of the electronic circuit. Integrated circuit devices have predominately resistance and capacitance. The resistance ("R") and capacitance ("C") create an RC time constant delay to a fast rising edge square wave, such as a clock signal. When clock signal delays are different between different areas of the integrated circuit, then the difference between the signal delays is called "skew".

Differences in clock signal delays are usually caused by differences in capacitance associated with the different circuit loads requiring the clock signal. Reliable operation of complex electronic circuits within an integrated circuit depends upon data being stable when a clock signal is received. If a clock signal is delayed, then the data may no longer be valid. Clock skew within an integrated circuit was not a major problem until the speed of integrated circuits increased dramatically.

An integrated circuit working at 10 mHz has a clock rate of 100 nanoseconds. An integrated circuit operating at 100 mHz requires a clock rate of 10 nanoseconds. The clock distribution illustrated in FIGS. 1–3 may have a clock skew of 2 nanoseconds. 2 nanoseconds at a clock rate of 100 nanoseconds is not significant, however, at a clock rate of 10 nanoseconds, it is a 20 percent variation which is significant.

Another problem with the clock distribution illustrated in FIGS. 1–3 is the difficulty in evenly distributing or balancing the capacitive loading of the integrated circuit devices. This is especially a problem when distributing clock signals to megabit random access memory ("megaram"). The megaram is so large and takes up so much space on the integrated circuit chip that clock signal routing for minimum skew is a problem.

SUMMARY OF THE INVENTION

The present invention allows a method and apparatus for minimizing clock skew by more evenly balancing integrated circuit clock signal loads, reducing the length of clock signal tributaries, and routing of clock signals to heretofore inaccessible locations on the integrated circuit chip die.

In contrast to prior methods and apparatus for routing clock signals on an integrated circuit, the present invention utilizes a ring substantially around the periphery of the integrated circuit chip and a trunk bisecting this ring. Tributaries are conveniently located to distribute the clock signal from the ring or trunk to the appropriate loads no matter where these loads are located on the integrated circuit chip.

The present invention connects each clock signal tributary through a buffer to a plurality of loads comprising a predefined amount of capacitance. The integrated circuit is partitioned into sections and further divided into regions determined by the required number of device loads or fan outs for placement of a local buffer. Each local buffer serves a region.

After all of the local buffer requirements and locations are specified, tributary routing may be determined. Each local buffer receives the clock signal from a respective tributary connected to either the clock signal ring or the clock signal trunk. An advantage of the present invention is the ability to easily connect a local buffer to a close proximity clock signal source.

Once the local buffers are connected to the closest proximate clock signal source, tributary loading is calculated. If one or more tributaries have significantly different loading than the majority of tributaries of the integrated circuit, then capacitive loading or "metal tuning" may be implemented. Metal tuning is simply adding metal conductors which form a capacitance. The metal tuning capacitance adds to the capacitive load of the tributary such that this tributary has substantially the same amount of capacitance as the other tributaries. In this way, skew is minimized for clock signal distribution throughout the integrated circuit.

Fan out for determining the number of local buffers may be, for example, between 8 and 16, but is not limited to any particular range except that too many local buffers (low fan out) would unduly crowd the integrated circuit layout, and too few local buffers (high fan out) would tend to overload the buffers and cause excessive tributary skew. An object of the present invention is to reduce the clock skew throughout the integrated circuit chip to less than 500 picoseconds. An integrated circuit having evenly distributed loads will tend to have lower skew than an integrated circuit having megacells such as megarams.

The present invention also has the ability to selectively inhibit clock signals at the local buffer. Inhibiting the clock at selected locations of the integrated circuit allows for reduction of power dissipation, and specific logical operations involving only part of the integrated circuit chip logic.

An object of the present invention is the ability to enable and disable selected clock drivers.

Another object is to minimize clock skew throughout the clock distribution network.

Yet another object is to automate clock distribution layout when designing an integrated circuit chip.

A feature of the present invention is a locally buffered clock ring.

Another feature is locally buffered clock signals.

Yet another feature of the present invention is multiple clock enables.

Still another feature is balancing of tributary loads.

An advantage of the present invention is a reduction in tributary length.

Another advantage is reduced delay between buffers.

Still another advantage of the present invention is reduced skew across a tributary.

A further advantage is accessing all input and output registers from a local buffer.

Still a further advantage is lower trunk and ring skew due to lower device fan out.

Other and further objects, features and advantages will be apparent from the following description of presently preferred embodiments of the invention, given for the purpose of disclosure and taken in conjunction with the accompanying drawings.

DETAILED DESCRIPTION OF THE PREFERRED EMBODIMENTS

Figure 1:
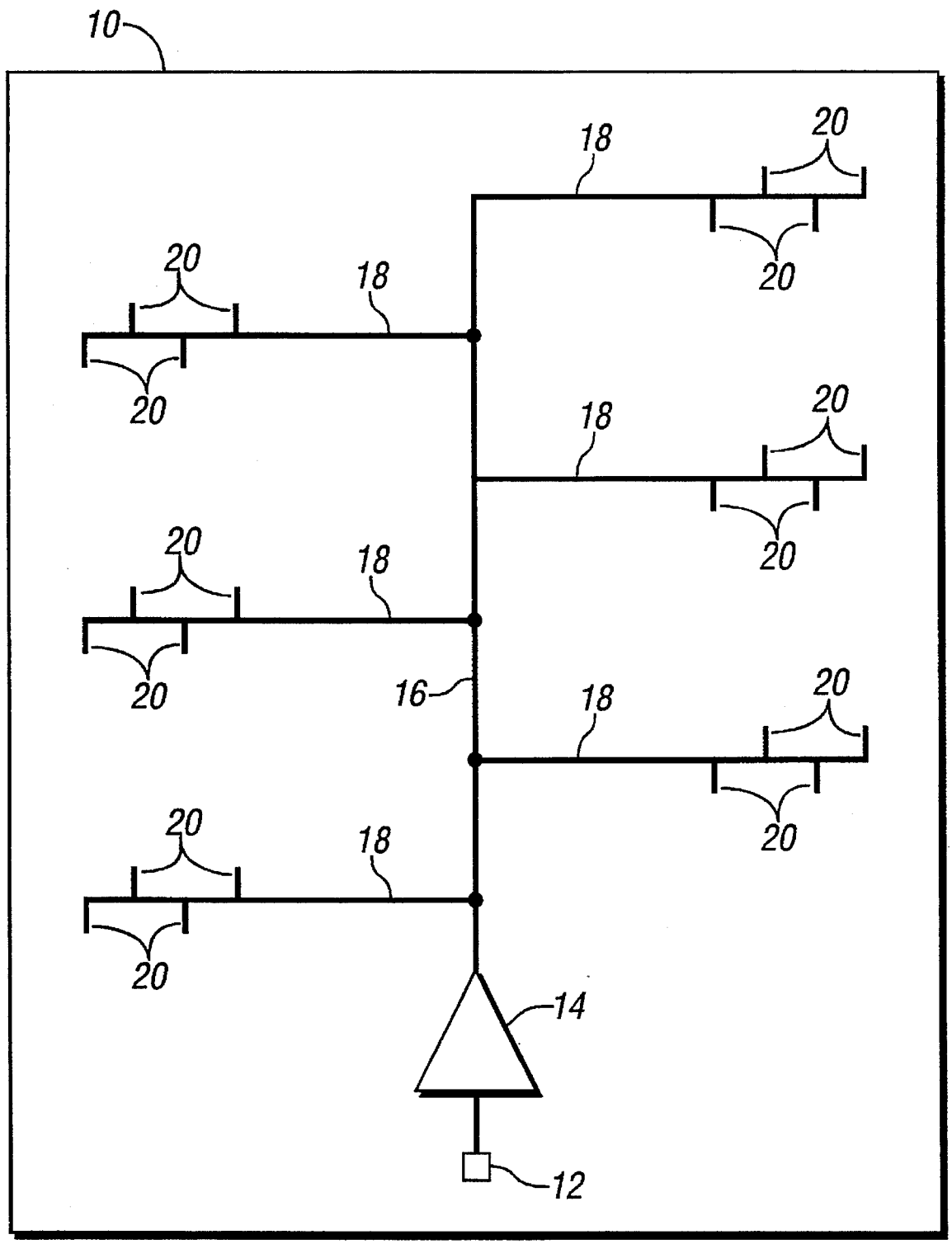
FIG. 1 is a schematic block diagram of a prior art clock distribution system on an integrated circuit chip die.
Figure 2:
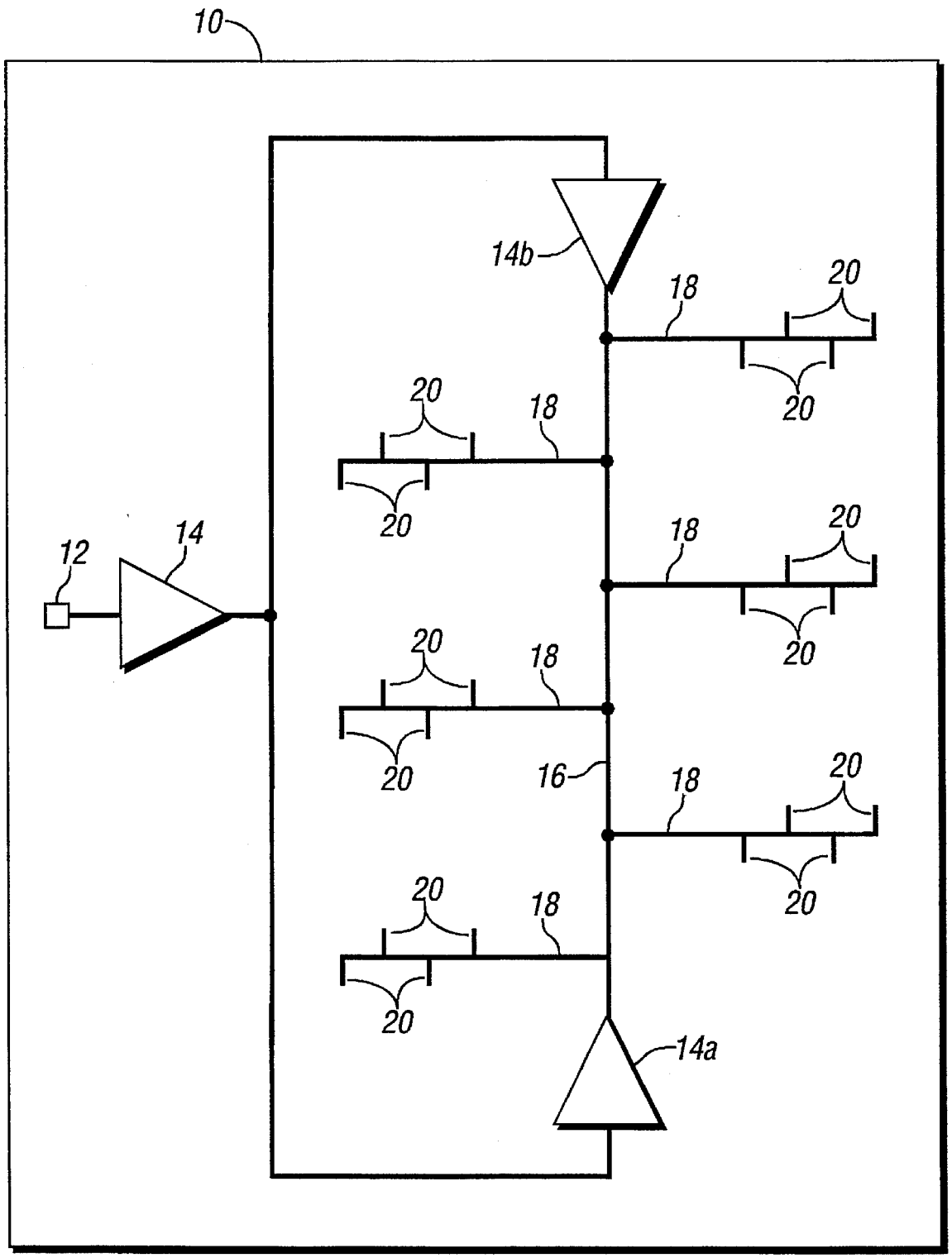
FIG. 2 is a schematic block diagram of another prior art clock distribution system.
Figure 3:
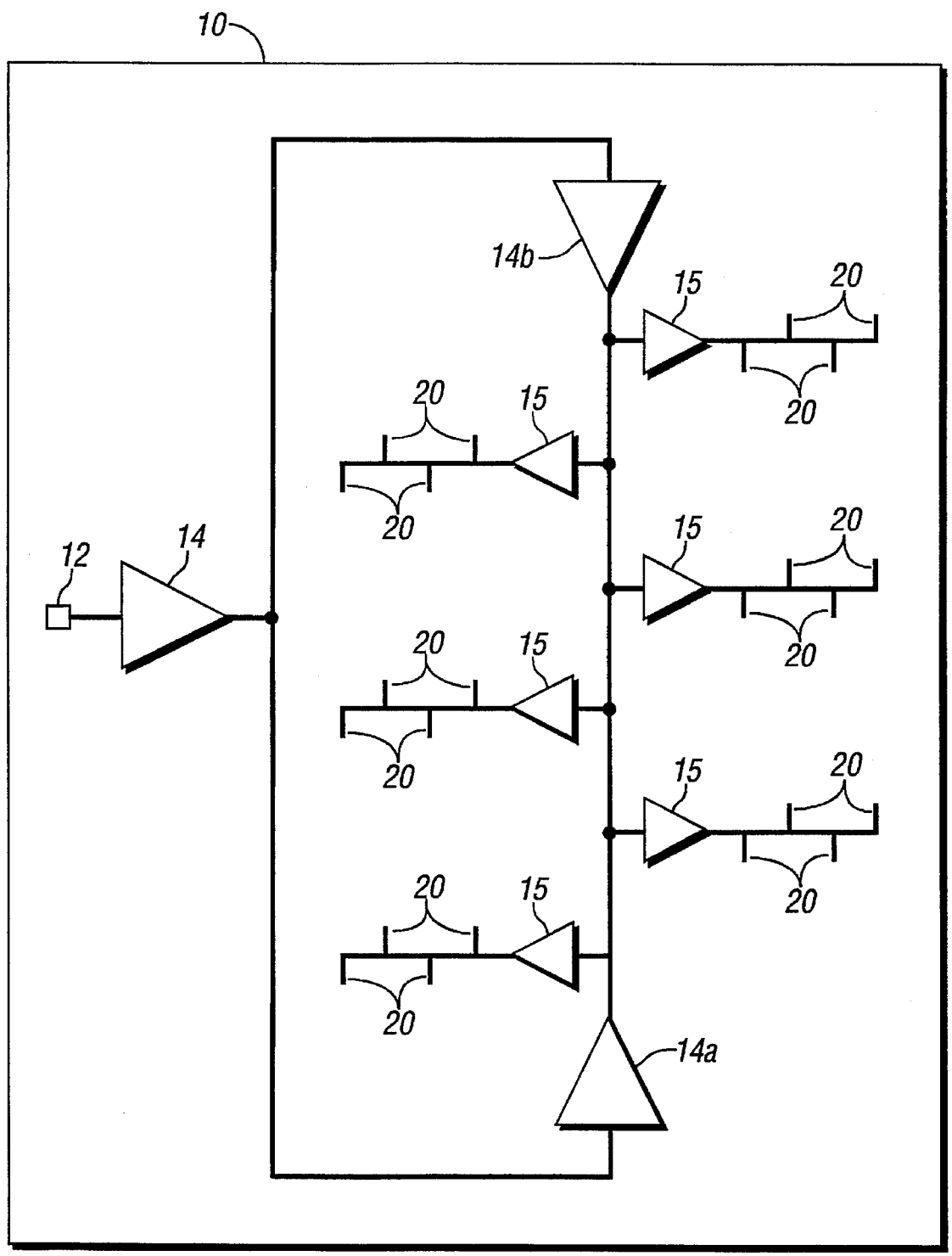
FIG. 3 is a schematic block diagram of yet another prior art clock distribution system.
Figure 4:
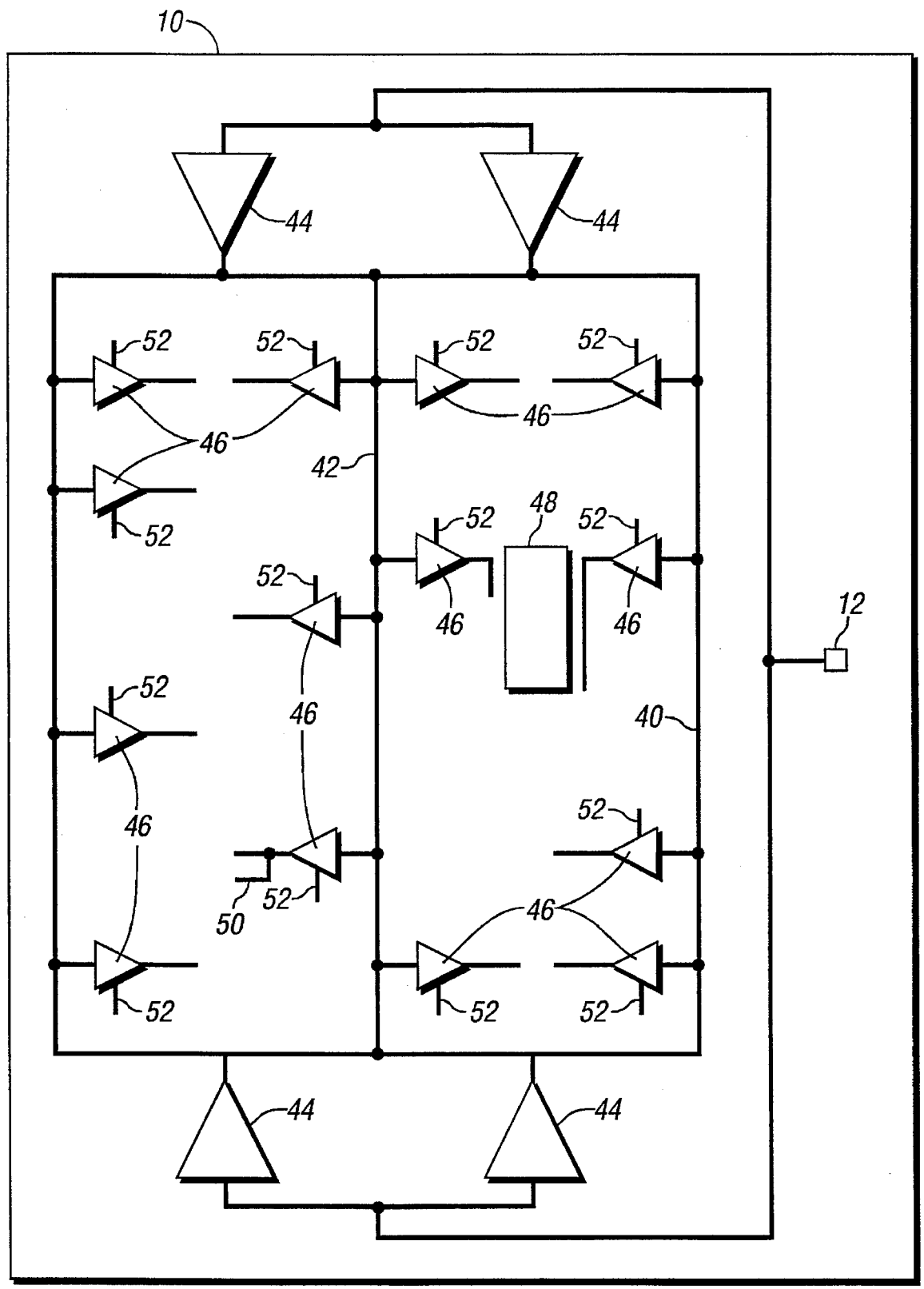
FIG. 4 is a schematic block diagram of a preferred embodiment of the present invention.
Figure 5:
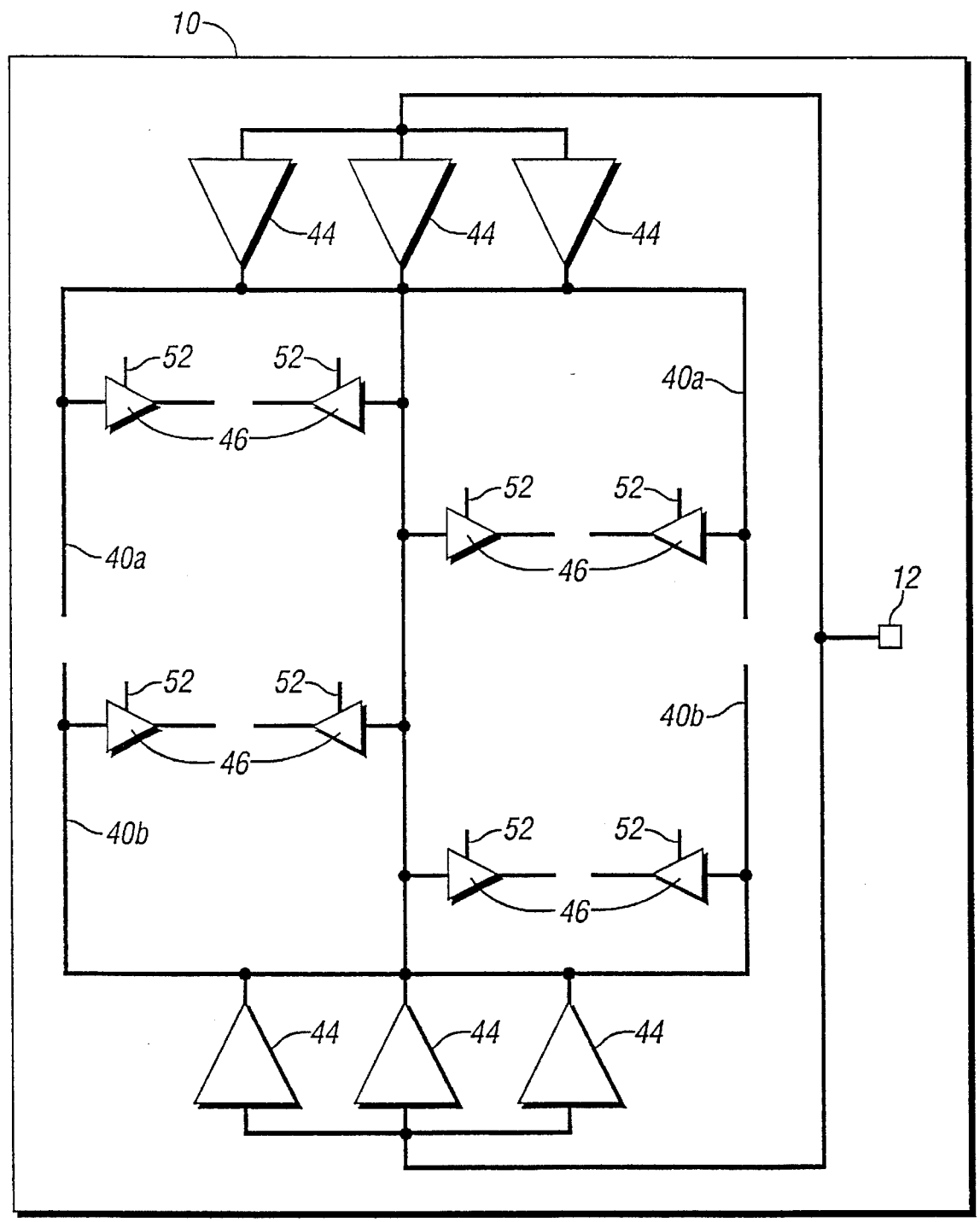
FIG. 5 is a schematic block diagram of another preferred embodiment of the present invention.

Referring now to the drawings, the details of the preferred embodiments are schematically illustrated. In the drawings the number 10 designates generally an integrated circuit chip die having digital logic circuits therein. FIGS. 4 and 5 illustrate preferred embodiments of the present invention. The integrated circuit chip die 10 utilizes a clock signal distribution system, in accordance with the present invention, comprising a clock signal ring 40, a clock signal trunk 42, ring/trunk buffers 44 and local buffers 46.

The ring 40 and trunk 42 are driven by the buffers 44 which are connected to the clock signal input 12. Multiple buffers 44 supply enough power to drive the loads comprising the local buffers 46. Referring to FIG. 5, a modified split ring comprising upper and lower half rings 40a and 40b, respectively, may be utilized in the present invention.

The outputs of each of the buffers 46 connect to a plurality of loads (not illustrated) comprising a predefined amount of capacitance. The integrated circuit 10 is partitioned into sections and further divided into regions determined by the required number of device loads or fan outs for placement of each local buffer 46.

After all of the local buffer requirements and locations of loads are specified, tributary routing may be determined. Each local buffer 46 receives the clock signal from a respective tributary connected to either the clock signal ring 40 or the clock signal trunk 42. An advantage of the present invention is the ability to easily connect the input of a local buffer 46 to a close proximity clock signal source such as the ring 40 or the trunk 42.

Once the local buffers 46 are connected to the closest proximate clock signal source, tributary loading is calculated. If one or more tributaries have significantly different loading than the majority of tributaries of the integrated circuit, then capacitive loading or "metal tuning" may be implemented. Metal tuning is simply adding metal conductors 50 (FIG. 4) which form added capacitance. The metal tuning capacitance 50 adds to the capacitive load of the tributary such that this tributary has substantially the same amount of capacitance as the other tributaries. In this way, skew is minimized for clock signal distribution throughout the integrated circuit 10.

Fan out for determining the number of local buffers 46 may be, for example, between 8 and 16, but is not limited to any particular range except that too many local buffers 46 (low fan out) would unduly crowd the integrated circuit layout, and too few local buffers 46 (high fan out) would tend to overload the buffers and cause excessive tributary skew. An object of the present invention is to reduce the clock skew throughout the integrated circuit chip to less than 500 picoseconds. An integrated circuit 10 having evenly distributed loads will tend to have lower skew than an integrated circuit having megacells 48 such as megarams. Calculating integrated circuit device loading parameters is well known to those skilled in the art of designing integrated circuits.

The present invention also has the ability to selectively inhibit clock signals at the local buffer 46. Using inhibit 52 to inhibit the clock at selected locations of the integrated circuit 10 allows for reduction of power dissipation, and specific logical operations involving only part of the integrated circuit chip logic.

The system and method of the present invention, therefore, is well adapted to carry out the objects and attain the ends and advantages mentioned, as well as others inherent therein. While a presently preferred embodiment of the invention has been given for purposes of disclosure, numerous changes in the details of construction, interconnection and arrangement of parts will readily suggest themselves to those skilled in the art, and which are encompassed within the spirit of the invention and the scope of the appended claims.

What is claimed is:

1. A method for reducing clock skew and power dissipation within an integrated circuit chip die by utilizing a clock signal ring having a plurality of signal tributaries and clock buffers connected thereto, comprising the steps of:

determining the number and location of integrated circuit chip die circuit loads required to be driven by clock signals from the plurality of signal tributaries;

partitioning the integrated circuit die into a plurality of sections of the clock signal ring, each section comprising a portion of the circuit loads within a region defined by the respective section;

determining the number of circuit loads within each section of the clock signal ring for establishing the number and location for each of a plurality of local clock buffers having inputs, outputs and output disables:

connecting the plurality of signal tributaries to the plurality of local clock buffer inputs;

determining the number of circuit loads connected to each of the plurality of local clock buffer outputs;

balancing the loading of each of the plurality of local clock buffer outputs so that the loading of each of the local clock buffer outputs is substantially the same; and disabling the local clock buffers for circuit loads not being used in order to reduce power consumption of the integrated circuit.

2. The method of claim 1, further comprising the step of creating a predetermined width for each of the plurality of signal tributaries.

3. The method of claim 1, further comprising the step of adding circuit loading to the output of a local clock buffer not having substantially the same circuit load as the other local clock buffers.

4. An apparatus for reducing clock skew within an integrated circuit chip die by utilizing a clock signal distribution system having a plurality of signal tributaries, comprising:

a plurality of integrated circuit chip die circuit loads requiring clock signals;

a clock signal distribution ring substantially around the perimeter of the integrated circuit chip die;

a clock signal distribution trunk bisecting said distribution ring and connected thereto;

a plurality of clock signal distribution tributaries proximately connected to said distribution ring or said distribution trunk: and a plurality of clock signal buffers connected between said distribution tributaries and said distribution ring, or between said distribution tributaries and said distribution trunk, said plurality of clock signal buffers having clock inhibiting circuits for inhibiting a clock signal to a connected circuit load for reducing the power consumption of the integrated circuit.

5. The apparatus of claim 4, wherein said distribution ring is bifurcated and each part connected to said distribution trunk.

\* \* \* \* \*